United States Patent [19]

Hotvet

[11] Patent Number: 4,718,099

[45] Date of Patent: Jan. 5, 1988

[54] AUTOMATIC GAIN CONTROL FOR HEARING AID

[75] Inventor: David A. Hotvet, Savage, Minn.

[73] Assignee: Telex Communications, Inc., Minneapolis, Minn.

[21] Appl. No.: 823,668

[22] Filed: Jan. 29, 1986

[51] Int. Cl.4 ...................... H03G 11/00; H04R 27/02
[52] U.S. Cl. ...................................... 381/68.4; 381/68; 381/106; 381/107; 381/71
[58] Field of Search ..................... 179/107 R, 107 FD; 381/68, 94, 102, 107, 108, 106, 71, 72, 68.4; 330/278, 281

[56] References Cited

U.S. PATENT DOCUMENTS

| 3,571,529 | 3/1971 | Gharib | 381/68 |
| 4,430,754 | 2/1984 | Ishigaki | 381/94 |
| 4,475,230 | 10/1984 | Fukuyama | 381/68 |
| 4,479,239 | 10/1984 | Rhines | 381/72 |
| 4,495,643 | 1/1985 | Orban | 381/106 |
| 4,506,381 | 3/1985 | Ono | 381/108 |
| 4,630,302 | 12/1986 | Kryter | 381/106 |

FOREIGN PATENT DOCUMENTS 1139365  1/1983  Canada ................. 381/106

OTHER PUBLICATIONS

G. A. Singer, "New Limiting Amplifier," *Audio Engineering*, Nov. 1950, pp. 18–19, 69–70.
"Speech Compressor/Limiter," *Wireless World*, May 1977, p. 80.
Walker and Dillon, "Compression in Hearing Aids," booklet, National Acoustic Laboratories, Report No. 90, Jun. 1982, Australia.
Technical Data Disclosure No. 4196, Telex Communications, Inc., publication No. 38108-834, May 1983.
Dillon and Walker, "Compression—Input or Output?", undated synopsis of above document AR, National Acoustic Laboratories, Australia.

*Primary Examiner*—Jin F. Ng
*Assistant Examiner*—L. C. Schroeder
*Attorney, Agent, or Firm*—Sturm & Baker, Ltd.

[57] ABSTRACT

A hearing aid having signal compression characteristics that adapt to the environment of the sound field in which it is operative in which an automatic gain control signal processor is responsive to the magnitude, duration and frequency of the signals in a sound field to control a compression amplifier so that the gain thereof is proportional to said signals.

20 Claims, 3 Drawing Figures

AUTOMATIC GAIN CONTROL FOR HEARING AID

BACKGROUND OF THE INVENTION

1. Field of the Invention

This invention relates to hearing aids and is more particularly directed to the automatic control of hearing aids to enhance the operation under presently difficult conditions encountered by a user as, for example, receiving communication from a source of sound located close to the user but surrounded by a multiplicity of other sources of sound, as in a crowded room with numerous conversations and extraneous "noise" of varying sound levels and occurring at varying distances from the user of a hearing aid.

2. Prior Art

The prior art with which this invention is concerned ranges from relatively simple hearing aid instruments, which may contain what have come to be known as agc, "compression" or automatic gain control features, and which may also require a user to physically manipulate a volume control so as to compensate for variations in the sound field in which a hearing aid instrument is operated or may, as is shown in U.S. Pat. No. 4,461,025 issued July 17, 1984, include complicated circuitry for completely eliminating the background "noise" components of a sound field that are typically characterized as "noise" in the sense that the user of a hearing aid instrument does not desire to receive, or perceive, such components of a signal.

Prior art hearing aid instruments have utilized compression circuits for reducing output distortion as the total input signal exceeds the maximum capability of a hearing aid instrument system and this is accomplished by utilizing a typical form of automatic gain control circuit to eliminate the accompanying distortion when an excessive input signal is encountered.

One such automatic gain control for this purpose is designed to effect a gain reduction during a relatively short time interval, that is known as the "attack time", to prevent discomfort or annoyance to the user of the hearing air instrument due to an excessive signal. On the other hand, when the excessive signal is no longer present or diminished, it may be desirable to have a short or a long release time, dependent upon the environmental conditions in which the hearing aid instrument is used, and the characteristics of the input signal. The fast attack time, typically less than ten milliseconds, has been determined to be reasonable whereas a typical release time may vary from ten milliseconds to much greater intervals of time. The aural perception of the hearing air user is influenced by the release time.

BRIEF DESCRIPTION OF THE INVENTION

My invention provides a hearing aid apparatus having an automatic gain control signal for controlling the gain of a compression amplifier which provides a uniform, "fast attack" time in response to an input signal exceeding a predetermined maximum value and a variable "release time" responsive to adapt to the various type of signals in the sound fields encountered by a hearing aid user.

Broadly, the principles of my invention are provided through the utilization of a signal characterizing means for providing a uniform "fast attack" characteristic for an automatic gain control signal in response to increases of the input signal over a predetermined maximum value and to provide a "release time" which varies in accordance with the frequency and duration of time intervals in which the input signal exceeds such predetermined value.

It has been observed that the signal to noise ratio is dramatically improved in the class of sound fields encountered by a typical hearing aid instrument user which contain a plurality of sources of sound of an undesired nature, and, in the sense that a sound field contains a plurality of sources of undesirable sound that is typically referred to as "noise" (unintelligible signal) and will contain fewer components of desirable sound that may be conveniently referred to as "intelligible" sound, the perception of the user is enhanced without having to resort to manual manipulation of the volume control in a hearing aid instrument or to experience the perceptible variations in sound intensity previously experienced in hearing aid instruments exhibiting a "fast attack" and "fast release" time regardless of the nature of the sound contained in a sound field.

In a preferred and the illustrated embodiment of my invention, a voltage controlled compression amplifier is configured to receive and respond to an automatic gain control signal in the form of a voltage that is derived from the signal appearing at the output of the amplifier and which will vary in accordance with the amount, or magnitude, of the output signal which exceeds a predetermined compression threshold value. The excessive output signal of the voltage controlled amplifier is supplied to vary the gain of the amplifier through circuit means including at least a pair of capacitors and a resistor which are connected to receive the automatic gain control signal derived from the output of the amplifier in such a manner that an automatic gain control signal of relatively short duration is operative to, in a sense, to directly and immediately reduce and then immediately restore the gain of the amplifier; and an automatic gain control signal of longer duration may be operative to immediately reduce the gain of the amplifier but will gradually restore the gain of the amplifier at a rate that varies directly with the duration and frequency of the received signal and the automatic gain control signal.

In a further embodiment of my invention, the same means for characterizing the AGC signal for controlling the voltage controlled input amplifier means is utilized to receive a plurality of AGC signals, one derived from the output of an input voltage controlled compression pre-amplifier and another derived from the output of a power amplifier to be respesentative of the sound power level (SPL) of the audio signal applied to the auditory sense organs of hearing aid instrument user. Again, for signals of a variable frequency and/or duration that exceed a predetermined value, the release time of the AGC signal controlling the gain of the voltage controlled input pre-amplifier is varied so as to enhance the output signal applied to the auditory sense organs through an increase in the "intelligible" signal-to-"noise" ratio and thereby improve the perception of the user. This may be accomplished through the addition of but a few uncomplicated components which respond to varying automatic gain control signal levels and durations to characterize the signals for controlling the gain of the voltage control input pre-amplifier.

BRIEF DESCRIPTION OF THE DRAWINGS

These and further objects and features of my invention will become apparent upon consideration of the following description and drawings in which.

DESCRIPTION OF THE PREFERRED EMBODIMENT

Figure 1:
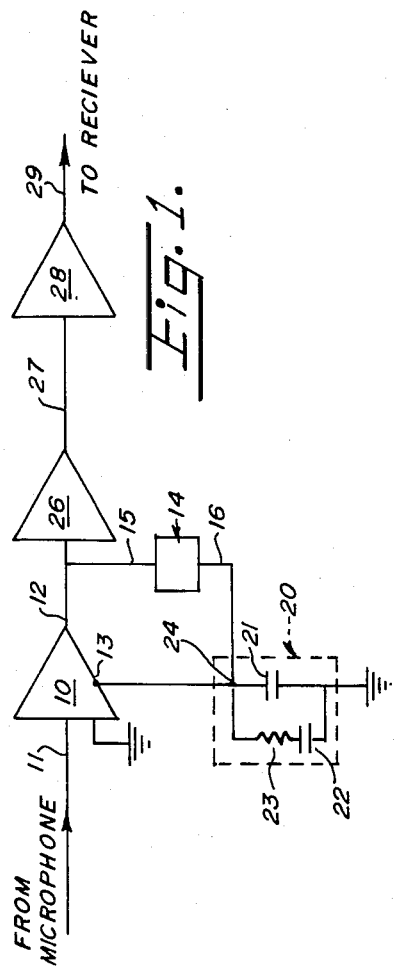
FIG. 1, is a schematic and diagrammatic illustration of a hearing aid embodying the principles of my invention.

Referring to FIG. 1 of the drawings, a diagrammatic and schematic drawing of a simplified hearing aid instrument includes a voltage controlled pre-amplifier 10, a tone control amplifier 26 and an output power amplifier 28 connected to receive a signal from a microphone through an input conductor 11 connected to voltage controlled amplifier 10, an output conductor 12 connecting the output of voltage controlled gain control amplifier 10 to tone control amplifier 26 and to an AGC signal source, indicated generally by reference character 14, an output conductor 27 connecting the output of tone control amplifier 26 to the input of power amplifier 28 and an output conductor 29 for connecting the output of amplifier 28 to an earphone or receiver.

Voltage controlled variable gain control pre-amplifier 10 further includes a gain control terminal 13 for connection to a source of signal for controlling the gain thereof from automatic gain control signal source 14.

Signal source 14 provides an output signal on conductor 16 which consists of a rectified component of the output signal appearing on output conductor 12, connected to amplifier 10, whenever the output level exceeds a predetermined maximum value. Conductor 16 is connected through terminal 24 on a signal characterizer 20 to gain control terminal 13 on a amplifier 10.

Signal characterizer 20 is shown comprised of capacitor 21 connected intermediate terminal 24 and a ground terminal and a resistor 23 and capacitor 22 connected in series across capacitor 21 and intermediate terminal 24 and the ground terminal. Capacitor 21 and capacitor 22 are typically of substantially different capacitance and resistor 23 may be selected from a range of higher values to provide an increased time constant when charging capacitor 22.

Figure 3:
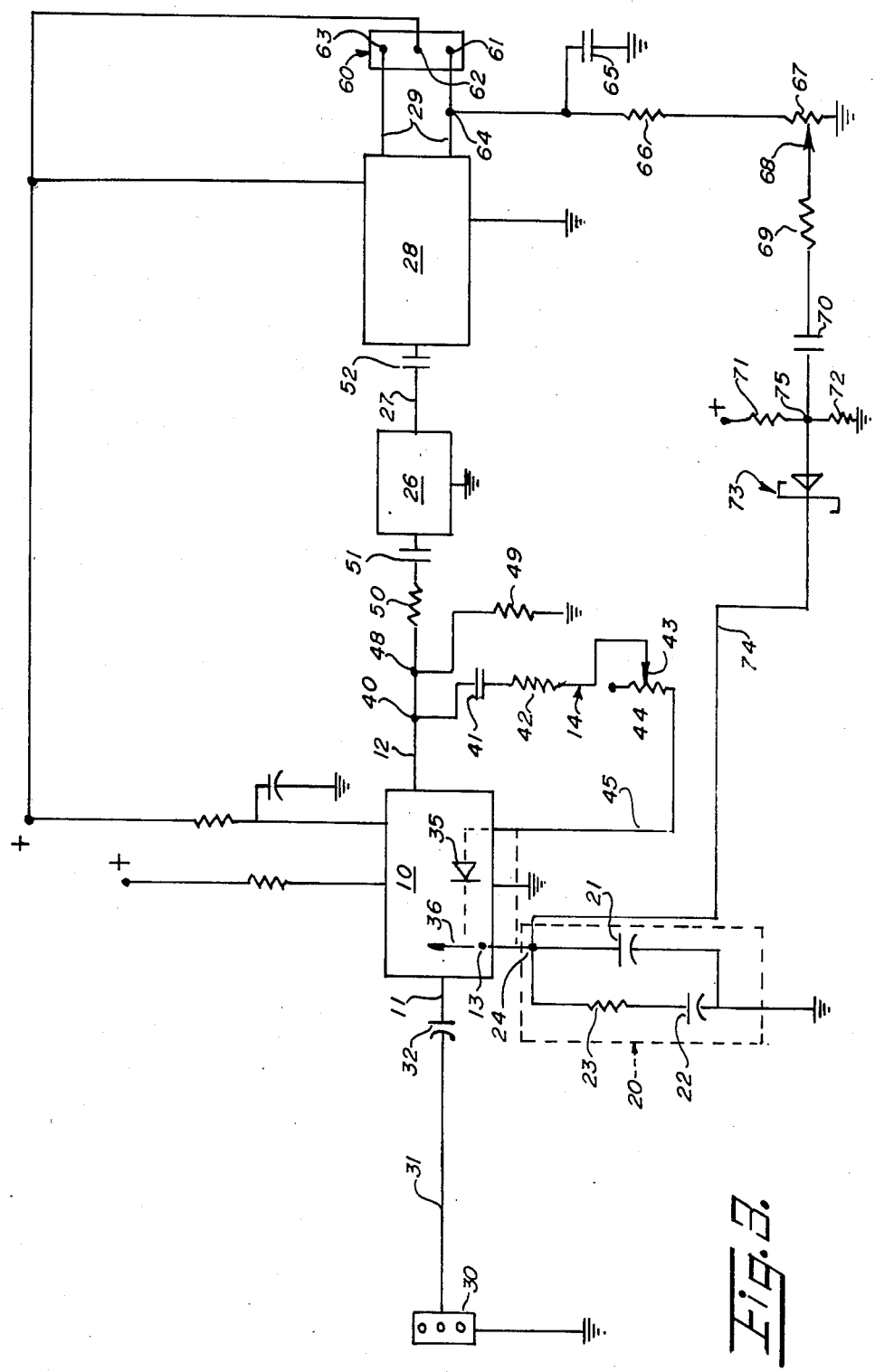
FIG. 3, is a block diagrammatic and schematic drawing of a hearing aid system illustrating a further embodiment of my invention.

Referring to FIG. 3 of the drawings, a more elaborate representation of a hearing aid instrument is shown including a microphone 30 and a receiver 60 operatively connected through voltage controlled variable gain pre-amplifier 10, tone control amplifier 26 and power amplifier 28.

Gain control amplifier 10 has an input terminal 11, connected to microphone 30 through capacitor 32 and conductor 31 and an output terminal connected to tone control amplifier 26 through an output conductor 12, terminal 40, terminal 48, resistor 50 and capacitor 51. The output of tone control amplifier 26 is shown connected to power amplifier 28 through conductor 27 capacitor 52 and the output conductors 29 of amplifier 28 are connected to terminals 61 and 63 on a receiver 60. Terminal 48 is connected to ground through a resistor 49 and terminal 40 is shown connected to a full wave AGC rectifying means 35 (shown in phantom outline) in voltage controlled variable gain pre-amplifier 10 through capacitor 41, resistor 42, wiper 43 on potentiometer 44 and conductor 45.

Signal characterizer 20 includes the elements described above and is further connected to terminal 64 on output 29 of power amplifier 28 through conductor 74, Schottky diode 73, terminal 75, capacitor 70, resistor 69, wiper 68 on potentiometer 67 and resistor 66. Terminal 64 is also connected to ground through capacitor 65.

Various portions of the amplifiers and circuitry are suitably connected to a source of current (not shown) and such connecting components are not further identified.

Figure 2:
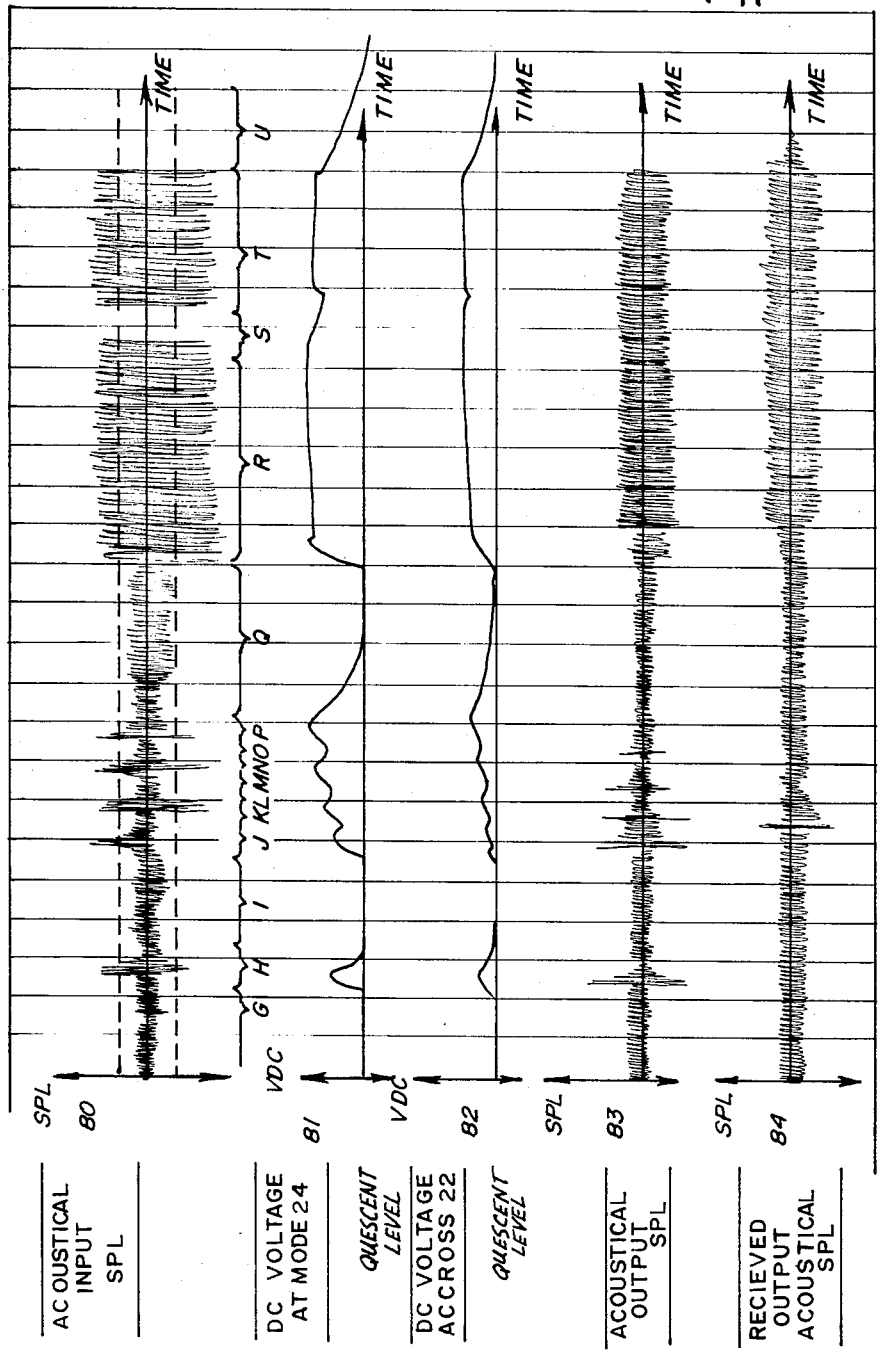
FIG. 2, is a family of curves illustrating the operation of the drawing of FIG. 1.

FIG. 2 contains a number of curves placed over a grid to illustrate the signals appearing at various portions of the apparatus described above. Curve 80 represents the sound power level of an acoustical input signal; curve 81 represents an AGC signal derived from the output of an amplifier; curve 82 represents a component of the AGC signal in curve 81 as derived from the output of an amplifier; curve 83 represents a compressed acoustical output (SPL) signal as may be applied to the auditory sense organs of a user; and curve 84 represents the perceived signal as sensed by the auditory organs of a hearing aid user.

As indicated under curve 80, the signals are divided into a plurality of discrete portions indicated by the letters G through U (inclusive) applied to the brackets appearing under the signal illustrated as curve 80. The vertical axis represents either voltage, or potential, or sound power level and the horizontal axis represent time during which a signal may occur.

The illustrated signal characterizer 20 is derived from a description contained in the November 1950 issue of Audio Engineering, pages 18, 19, 69 and 70 in an article entitled "Performance and Operation of a New Limiting Amplifier" by G. P. Singer—a description of recently developed broadcast-type limiting amplifier and its characteristics under various input-signal conditions".

The threshold magnitude for initiating operation of the automatic gain control circuit into a compression mode of operation, also known as the "knee" of the compression curve, is determined by the characteristics of a given instrument and the physiological characteristics of a user. This may be determined by designers of hearing aid apparatus and is based upon experience and other data accumulated so that the sum total of the entire hearing aid instrument including the automatic gain control circuit, is satisfactory to present a comfortable, intelligible audio signal for perception by the audio sense organs of a user.

However, a long standing undesirable operation occurs whenever the input signal from the sound field in which the instrument is operable, contains undesireable "noise", such as in a crowded room with many conversations taking place, and, depending upon the time constant or reaction time of a given AGC compression control signal, the user either experiences perceptions of a rapid fluctuation in volume, or SPL, or a continued decrease in sound pressure output so that a severe loss of intelligibility is perceived and, for most practical purposes, the instrument is rendered substantially useless.

By applying the principles of my invention to a hearing aid instrument in controlling the operation of the compression mode of a controlled gain amplifier, relatively short "bursts" or "pulses" of energy are, in effect, substantially reduced and/or eliminated from the reporduced signal applied to the auditory sense organs of a user. "Intelligible" signals, which when combined with the background "noise" result in an overall reduction in gain with respect to the excessive signal received by a microphone but permit a combined signal, having enhanced signal to "noise" ratio, to be amplified within the regime of a permissible sound power level so that a greater proportion of the signal applied to the audio sense organs of a user consists of the "intelligible" component and the previously obtained perception of a loss of intelligibility or other forms of discomfort is eliminated and the user is thereby better able to understand what he is seeking to hear.

In the curves of FIG. 2, an input signal shown on the curve 80 contains a number of components variable about the zero axis and shown in relation to a pair of horizontal dotted lines which indicate the maximum level of energy that may reasonably be accommodated by the electrical amplifiers of a hearing aid without producing distortion.

The initial section, G, represents random or background noise; sections H,J,L,N, and P represent "noise" pulses and section R and T represent intelligible sound energy. Whenever the signal represented by curve 80 exceeds the maximum values indicated by the dotted horizontal lines, the voltage or potential appearing at capacitors 21 and 22 will be affected in the manner shown in curves 81 and 82 to provide a transient AGC signal that produces the output illustrated on curve 83 which is then perceived by a hearing aid user as illustrated on curve 84.

When considering a period of random or background noise in Section G of the curves followed by a pulse of noise of less than 12 milliseconds, the relationships as illustrated by section H on the remainder of the curves are obtained, the AGC signal for controlling the compression amplifier is such that compression to the maximum desired limits as illustrated on curve 83 occurs and the "noise" pulse remains unperceived by the hearing aid user.

When a series of pulses illustrated by Sections J,L,N, and P are received, the characterized control signal appearing thereunder on curve 81 is obtained and the relationships are seen in the remainder of the curves. Similarly, the "intelligible" signal of portions R and T of curve 80 result in the phenomina shown in cruves 81,82,83, and 84.

Referring specifically to Sections J-Q (inclusive) of the curve, it may be seen that when a plurality of relatively closely spaced pulses are received, curve 81 indicates that capacitor 21 acquires a voltage or potential that increases in steps to serve as the compression control signal for the amplifier whereby instead of having a successive plurality of compression control signals as represented in Section H of curve 81, the potential rises in steps that are imperceptible to the hearing aid user and thereby do not present a source of confusion resulting from the successive "noise" pluses of Sections J,L,N, and P of the signal shown on curve 80.

When the relatively longer duration of an "intelligible" signal appears, as in Sections R and T of the curve of FIG. 80, capacitors 21 and 22 are charged as shown on curves 81 and 82 respectively, the output signal of curve 83 is compressed to the desired value and the perception of the hearing aid user is as shown on curve 84.

In an operative embodiment of my invention compression amplifier 10 comprised a commercially available LC/LD No. 502, low distortion, AGC Compression Preamplifier supplied from Linear Technology Inc. of Burlington, Ontario, Canada L7R 3Y3 was utilized in connection with a signal characterizer having values of 0.47 microfarads for capacitor 21, 2.2 microfarads for capacitor 22 and 220K ohms for resistor 23.

In the embodiment of FIG. 3, an AGC-compression component is added from output 29 on power amplifier 28 in which resistor 67 is a 10K ohm potentiometer, resistor 69 is a 3.3K ohm resistor, capacitor 70 is a 2.2 microfarad capacitor; resistors 71 and 72 are 220K ohm resistors and diode 73 is a Schotkey diode exhibiting the characteristics of a low forward voltage drop and rectification of the signal appearing at output 29 representative of the sound pressure level output that is to be applied to the auditory sense organ of a user through microphone 60. While the operation of signal characterizer 20 remains essentially the same, it may be seen that what is known as "input" and "output" compression are utilized to form the signal that appears at terminal 24 on signal characterizer 20 and the operation remains essentially the same as that described above in connection with the curves of FIG. 2.

I claim:

1. In a hearing aid, a signal processor responsive to the frequency, and energy content of a signal to be processed for compressing a signal when the amplitude is above a predetermined threshold level, comprising in combination; a terminal for connection to a compression amplifier; and a plurality of time constant means connected to said terminal, said time constant means being characterized to provide individual time constants of a diverse character for providing a compression amplifier control signal having a short attach and relatively longer release time, said release time being proportional to the duration of an input signal when the amplitude of said input signal is above said predetermined threshold level.

2. The subject matter of claim 1 in which there are at least first and second time constant means.

3. The subject matter of claim 1 in which the time constant means include a capacitor.

4. The apparatus of claim 1 in which one of the time constant means is a capacitor and the remainder of said time constant means are capacitors connected to the terminal through serial impedance means.

5. A compression control signal processor for a hearing aid instrument comprising, in combination; an input terminal adapted for connection to a source of signal of variable amplitude, duration and frequency of occurrence; and a plurality of time constant means connected to said input terminal and responsive to the d.c. components in a signal present at said terminal whereby the potential at said terminal responds at a rapid rate when said source of signal exceeds a predetermined threshold level and is increasing, and at a variable lesser rate, proportional to the duration of said source of signal when the amplitude of said source of signal is above a predetermined threshold level and said source of signal is decreasing, said variable rate increasing in proportion to the duration of said signal.

6. In combination with a human sound sense organ facility, a compression control for reducing the effect of undesired transient noise; comprising in combination; acoustical sound transducing means for receiving acoustical energy signals; amplifying means; gain control means exhibiting variable response to said signals proportional to the amplitude, frequency and duration and operable to rapidly compress said signal when the signals are increasing and to release said compression at a relatively slower, variable rate proportional to the duration of said signals when the amplitude of said signals exceeds a predetermined threshold level, and when said signals are decreasing; and transducing means converting the output of said amplifying means for application to the auditory sense organ of a hearing air user.

7. In a hearing aid of the class including a receiver and a microphone and amplifying means connecting the output of said microphone to said receiver and said amplifier including means for controlling the gain thereof in accordance with the ambient level of sound energy present in the environment of a user, the improvement, comprising in combination; further gain controlling means for said amplifier, said further gain controlling means including means for determining the presence of sound energy in excess of a predetermined level to reduce the gain of said amplifier to a predetermined level, means for immediately reducing the gain of said amplifier to provide an output not in excess of said predetermined level and means for effecting the return of the gain of said amplifier to said ambient level, said last named means including means responsive to the duration of the sound energy in excess of said predetermined level for increasingly variably restoring the gain of said amplifying means in proportion to said duration.

8. The apparatus of claims 7 in which the further gain controlling means exhibits the characteristics of uniform fast attack time response to an excess signal and a relatively slower variable release time proportional to the duration of an excess signal for restoring the gain of the amplifier.

9. The apparatus of claim 8 in which the further gain controlling means exhibits a plurality of time constants.

10. The apparatus of claim 9 in which a plurality of time constants are provided by plurality of capacitors, all but one of which are serially connected to an impedance means and are selected to exhibit diverse values and time constants.

11. A hearing aid comprising in combination;
(a) a microphone;
(b) a receiver;
(c) electrical signal amplifying means, including a source of electrical power, connected intermediate said microphone and said receiver, said electrical signal amplifying means including first gain control means responsive to the average level of signal from said microphone and second and third gain controlling means responsive to the signal at said microphone, said second gain controlling means responsive to the signal at said microphone in excess of a predetermined value to reduce the gain of said amplifying means so that the signal at said microphone remains at said predetermined value, said second gain control means being effective as long as said excess signal is present and said third gain controlling means being effective to reduce the gain of said amplifying means in accordance with said second gain controlling means and the frequency and amplitude of the signal exceeding the predetermined value at said microphone, whereby as the frequency or amplitude of the signal exceeding the predetermined value increases, the gain of said amplifying means is controlled by said third gain control means.

12. In combination with a hearing aid having a signal processing variable gain amplifying means including input, gain control and output terminals, said input terminal connected to a source of audio signal and said output terminal connected to a receiver; gain control means connected to said output terminal and responsive to an output signal in excess of a predetermined magnitude for providing a gain control signal related to said excess output signal and signal characterizing means connecting said gain control signal to the gain control terminal on said amplifying means, said signal characterizing means including means operable to provide a further component to very the effective rate of change of a compression signal in accordance with the frequency of occurrence and the energy content of said signal whereby the compression signal has a short attack and a relatively longer release time, said release time further being proportional to the duration of said signal in excess of a predetermined magnitude.

13. The method of reducing the effect of pulses of high amplitude sound energy on the auditory sense organs of a hearing aid user which comprises:
controlling the gain of a hearing aid instrument so that the gain is immediately reduced on the occurrence of a period of high amplitude sound energy and the gain is restored at a slower rate proportional to the duration of said high amplitude sound energy.

14. A hearing aid for use under ambient conditions exhibiting the repetitive occurrence of periods of high amplitude sound energy at a random frequency, comprising in combination;
a microphone;
a receiver;
controllable gain amplifying means connected intermediate said microphone and said receiver, said controllable gain amplifying means including gain control means responsive to the level of the signal from said microphone above a predetermined threshold level for rapidly reducing the gain of said amplifying means and restoring the gain when the signal from said microphone is reduced to said predetermined level and further means connected to said means responsive to the level of said signal for increasing the time for said gain control means to restore the gain in proportion to the duration of a high amplitude sound energy level.

15. An automatic gain control hearing aid characterized by having a short attack time and relatively longer release time said release time being proportional to the duration of an input signal when the amplitude of the signal is above a predetermined threshold level.

16. The subject matter of claim 15 in which the release time is longer for input signals of long duration.

17. The apparatus of claim 6 in which the amplifying means exhibits the characteristics of a type LC/LD No. 502 Linear Technology Inc. AGC compression preamplifier.

18. The apparatus of claim 17 in which the gain control means includes a first capacitor of 0.47 microfarad capacity connected in parallel with a second capacitor of 2.2 microfarad capacity and a resistor of 220,000 ohms.

19. The apparatus of claim 2 in which said first time constant means is a 0.47 microfarad capacitor and said second time constant means is a 2.2 microfarad capacitor connected in series with a 220,000 ohm resistor.

20. The apparatus of claim 8 in which the further gain controlling means includes a 2.2 microfarad capacitor and a 220,000 ohm resistor connected in series with a 0.47 microfarad capacitor and the amplifier exhibits the input characteristics of an LC/LD 502 AGC compression amplifier.

* * * * *

REEXAMINATION CERTIFICATE (1631st)

United States Patent [19]

Hotvet

[11] B1 4,718,099

[45] Certificate Issued Jan. 28, 1992

[54] AUTOMATIC GAIN CONTROL FOR HEARING AID

[75] Inventor: David A. Hotvet, Savage, Minn.

[73] Assignee: Telex Communications, Inc.

Reexamination Request:
No. 90/001,641, Nov. 21, 1988

Reexamination Certificate for:
Patent No.: 4,718,099
Issued: Jan. 5, 1988
Appl. No.: 823,668
Filed: Jan. 29, 1986

[51] Int. Cl.$^5$ ............... H03G 11/00; H04R 27/02
[52] U.S. Cl. ............... 381/68.4; 381/68; 381/106; 381/107; 381/71
[58] Field of Search ............... 381/68, 68.2, 68.4, 381/94, 102, 106, 107, 108, 71, 72; 330/278, 281

[56] References Cited

U.S. PATENT DOCUMENTS

| | | | |
|---|---|---|---|
| 3,818,149 | 6/1974 | Stearns et al. | 381/68.2 |
| 3,920,931 | 11/1975 | Yanick, Jr. | 381/68.2 |
| 4,475,230 | 10/1984 | Fukuyama et al. | 381/68 |
| 4,517,415 | 5/1985 | Laurence | 381/68.4 |
| 4,543,453 | 9/1985 | Brander | 381/68.4 |

FOREIGN PATENT DOCUMENTS

| | | |
|---|---|---|
| 1139365 | 1/1983 | Canada . |
| 3027715 | 2/1982 | Fed. Rep. of Germany . |
| 56-58511 | 12/1981 | Japan . |
| 483177 | 1/1970 | Switzerland . |
| 2073977 | 10/1981 | United Kingdom . |

OTHER PUBLICATIONS

Author unknown, "Telex Communicaitons, Inc. Preliminary Technical Data document No. 4216", dated Oct. 1983, 1 page.

Author unknown, "Telex Sales Bulletin No. HA 84–111", dated 10-10-84, Subject: The Dual–time Constant Compression Concept, 3 pages.

Author unknown, "Telex Communications, Inc. Preliminary Technical Data document No. 4216-1", dated Nov. 1984, 4 pages.

Author unknown, Stereo Review, Tape Recording & Buying Guide, 1982, p. 120.

Telex 363C, Adaptive Compression Hearing Aid Specification Sheet, May 1985, 4 pages.

Libby, Robert, "Fitting the Environment—Some Evolutionary Approaches", Hearing Instruments, vol. 38, No. 8, Aug. 1987, pp. 8–16.

*Primary Examiner*—James L. Dwyer
*Attorney, Agent, or Firm*—Warren A. Sturm

[57] ABSTRACT

A hearing aid having signal compression characteristics that adapt to the environment of the sound field in which it is operative in which an automatic gain control signal processor is responsive to the magnitude, duration and frequency of the signals in a sound field to control a compression amplifier so that the gain thereof is proportional to said signals.

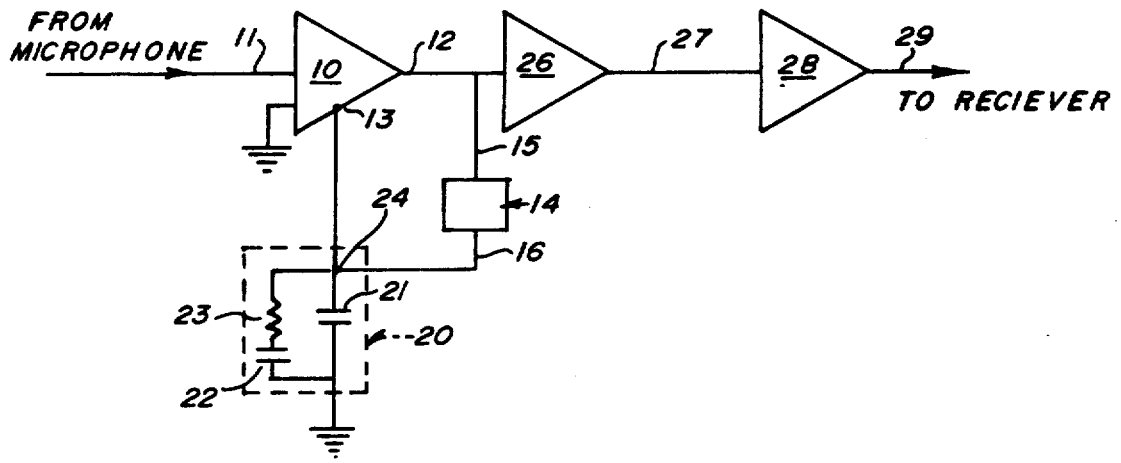

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 5 is confirmed.

Claims, 1, 3, 4, 6-9, 11-16 and 20 are cancelled.

Claims 2, 10 and 17 are determined to be patentable as amended.

Claims 18 and 19, dependent on an amended claim, are determined to be patentable.

New claims 21-24 and 25 are added and determined to be patentable.

2. The subject matter of claim [1] *5* in which there are at least first and second time constant means.

10. The apparatus of claim [9] *5* in which a plurality of time constants are provided by plurality of capacitors, all but one of which are serially connected to an impedance means and are selected to exhibit diverse values and time constants.

17. The apparatus of claim [6] *5* in which the amplifying means exhibits the characteristics of a type LC/LD No. 502 Linear Technology Inc. AGC compression preamplifier.

*21. The method of reducing the effect of pulses of high amplitude sound energy on the auditory sense organs of a hearing aid user which comprises:*

*controlling the gain of a hearing aid so that the gain is reduced within a constant or uniform time interval after the occurrence of a period of high amplitude sound energy and the gain is restored at a continuously variable slower rate proportional to the duration of said high amplitude sound energy.*

*22. The apparatus of claim 5 in which all but one of the time constant means include serially-disposed resistor means.*

*23. In combination with a human sound sense organ facility, a compression control for reducing the effect of undesired transient noise, comprising in combination:*

*accoustical sound transducing means for receiving accoustical energy signals;*

*amplifying means exhibiting the characteristics of a type LC/LD No. 502 Linear Technology, Inc. AGC compression preamplifier;*

*gain control means including a first capacitor of 0.47 microfarad capacity connected in parallel with a second capacitor of 2.2 microfarad capacity and a resistor of 220,000 ohms, exhibiting variable response to said signals proportional to the amplitude, frequency and duration and operable to rapidly compress said signal at a uniform rate when the signals are increasing and to release said compression at a relatively slower, variable rate proportional to the duration of said signals when the amplitude of said signals exceeds a predetermined threshold level, and when said signals are decreasing; and,*

*transducing means converting the output of said amplifying means for application to the auditory sense organ of a hearing aid user.*

*24. In a hearing aid, a signal processor responsive to the frequency and energy content of a signal to be processed for compressing a signal when the amplitude is above a predetermined threshold level, comprising in combination:*

*a terminal for connection to a compression amplifier; and,*

*a plurality of time constant means including at least first and second time constant means, said first time constant means comprising a 0.47 microfarad capacitor and said second time constant means comprising a 2.2 microfarad capacitor connected in series with a 220,000 ohm resistor, connected to said terminal, said time constant means being characterized to provide individual time constants of a diverse character for providing a compression amplifier control signal having a short attack and relatively longer release time, said release time being proportional to the duration of an input signal when the amplitude of said input signal is above said predetermined threshold level.*

*25. In a hearing aid of the class including a receiver and microphone and amplifying means, the amplifying means exhibiting the input characteristics of an LC/LD 502 AGC compression amplifier, and connecting the output of said microphone to said receiver and wherein said amplifier including means for controlling the gain thereof in accordance with the ambient level of sound energy present in the environment of a user, the improvement, comprising in combination; further gain controlling means exhibiting the characteristics of a uniform fast attack time in response to an excess signal and a relatively slower variable release time proportional to the duration of an excess signal for restoring the gain of the amplifier for said amplifier, said further gain controlling means including a 0.47 microfarad capacitor and a 220,000 ohm resistor connected in series with a 2.2 microfarad capacitor and means for determining the presence of sound energy in excess of a predetermined level to reduce the gain of said amplifier to a predetermined level, means for immediately reducing the gain of said amplifier to provide an output not in excess of said predetermined level and means for effecting the return of said amplifier to said ambient level, said last named means including means responsive to the duration of the sound energy in excess of said predetermined level for increasingly variably restoring the gain of said amplifying means in proportion to said duration.*

* * * * *